United States Patent
Schmidt et al.

(10) Patent No.: US 11,010,532 B2
(45) Date of Patent: May 18, 2021

(54) SIMULATION METHOD AND SYSTEM

(71) Applicant: Samsung Electronics Co., Ltd., Suwon-si (KR)

(72) Inventors: Alexander Schmidt, Suwon-si (KR); Dong-Gwan Shin, Hwaseong-si (KR); Anthony Payet, Seongnam-si (KR); Hyoung Soo Ko, Hwaseong-si (KR); Seok Hoon Kim, Suwon-si (KR); Hyun-Kwan Yu, Suwon-si (KR); Si Hyung Lee, Hwaseong-si (KR); In Kook Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/794,045

(22) Filed: Feb. 18, 2020

(65) Prior Publication Data
US 2020/0342157 A1    Oct. 29, 2020

(30) Foreign Application Priority Data

Apr. 29, 2019 (KR) .......... 10-2019-0049888
Aug. 7, 2019 (KR) .......... 10-2019-0096156

(51) Int. Cl.
*G06F 30/367* (2020.01)
*G06F 30/398* (2020.01)
*H01L 27/02* (2006.01)

(52) U.S. Cl.
CPC .......... *G06F 30/398* (2020.01); *G06F 30/367* (2020.01); *H01L 27/0207* (2013.01)

(58) Field of Classification Search
CPC ... G06F 30/398; G06F 30/367; H01L 27/0207
See application file for complete search history.

(56) References Cited

U.S. PATENT DOCUMENTS 6,926,816 B2   8/2005   Sano et al.
6,959,427 B2   10/2005  Kimura
(Continued)

FOREIGN PATENT DOCUMENTS

JP   4281047 B2   6/2009
JP   4627268 B2   11/2010
(Continued)

OTHER PUBLICATIONS

Kolandouz et al., "Kinetic Model of SiGe Selective Epitaxial Growth Using RPCVD Technique," ECS Transactions, 33 (6) 581-593 (2010).
(Continued)

*Primary Examiner* — Nghia M Doan
(74) *Attorney, Agent, or Firm* — Muir Patent Law, PLLC

(57) ABSTRACT

A simulation method includes storing a plurality of structure parameters of transistors for a semiconductor chip, imaging generating a first local layout which includes a first structure parameter extracted from a semiconductor device included in the first local layout, the first structure parameter being an actual parameter determined using the imaging equipment, generating second to n-th local layouts by modifying the first structure parameter included in the first local layout, wherein the second to n-th local layouts respectively have second to n-th structure parameters modified from the first structure parameter, calculating first to n-th effective density factors (EDF) respectively for the first to n-th structure parameters, determining a first effective open silicon density for a first chip using the first to n-th effective density factors and a layout of the first chip, and calculating first to m-th epitaxy times for first to m-th effective open silicon densities.

19 Claims, 12 Drawing Sheets

(56) References Cited

U.S. PATENT DOCUMENTS

| | | | |
|---|---|---|---|
| 7,383,521 | B2 | 6/2008 | Smith et al. |
| 7,958,462 | B2 | 6/2011 | Hashima et al. |
| 8,555,224 | B2 | 10/2013 | Ishizu et al. |
| 2006/0228850 | A1 | 10/2006 | Tsai et al. |
| 2016/0063156 | A1* | 3/2016 | Joshi ............... G06Q 10/04 703/2 |
| 2017/0344683 | A1 | 11/2017 | Kamon et al. |
| 2018/0121587 | A1 | 5/2018 | Monga et al. |
| 2018/0365370 | A1 | 12/2018 | Egan et al. |
| 2019/0187375 | A1* | 6/2019 | Nemouchi ........... G02B 6/1225 |

FOREIGN PATENT DOCUMENTS

| | | |
|---|---|---|
| JP | 4874207 B2 | 2/2012 |
| KR | 10-1494808 B1 | 2/2015 |
| KR | 10-2018-0046105 A | 5/2018 |
| KR | 10-2019-0003804 A | 1/2019 |

OTHER PUBLICATIONS

Martin-Bragado et al., "Kinetic Monte Carlo simulation for semiconductor processing: A review," Progress in Materials Science, vol. 92, pp. 1-32, Mar. 2018.

Wang et al., "Integration of highly-strained SiGe materials in 14nm and beyond nodes FinFET technology," Solid-State Electronics, vol. 103, pp. 222-228, Jan. 2015.

Crose et al., "Multiscale modeling and operation of PECVD of thin film solar cells," Chemical Engineering Science, vol. 136, pp. 50-61, Nov. 2, 2015.

Dollet, A., "Multiscale modeling of CVD film growth—a review of recent works," Surface and Coatings Technology, 177-178, pp. 245-251, 2004.

* cited by examiner

SIMULATION METHOD AND SYSTEM

This application claims priority to Korean Patent Application No. 10-2019-0049888, filed on Apr. 29, 2019 and No. 10-2019-0096156, filed on Aug. 7, 2019, in the Korean Intellectual Property Office, the disclosure of each of which is incorporated herein in its entirety.

BACKGROUND

1. Technical Field

The present inventive concept relates to a simulation method and system.

2. Description of the Related Art

An epitaxy process using chemical vapor deposition (CVD) may be used to form a source and a drain of a transistor. The epitaxy process is typically performed on the entire wafer.

Various types of transistors are disposed on one wafer, and patterns that form the transistors have different dimensions depending on the type of transistor. When the dimensions of the patterns are changed, a SiGe growth rate is also changed. Therefore, for the same period of time, a source and a drain may be formed to a different extent depending on the type of transistor, which may affect the performance of the transistor.

Chemical Vapor Deposition (CVD) epitaxy is one of the most important technology processes for modern logic transistor manufacturing, since it is a key process used for Source/Drain (S/D) region formation. Since epitaxy steps are typically performed for the whole wafer simultaneously, finding an epitaxy process window that would allow S/D shape control for all transistor types in a chip is a difficult task due to differences in transistor dimensions, for example of standard cells versus SRAM. Thus CVD process optimization often uses multiple trial and error experimental iterations that are both expensive and time consuming. Moreover, an additional technology development obstacle is a strong dependence of SiGe growth rate on the pattern density and position on the wafer, for example, due to incoming precursor flux non-uniformities. This is described in M. Kolandouz, L. Maresca, R. Ghandi, A. Khatibi and H. H. Radamson, "Kinetic Model of SiGe Selective Epitaxial Growth Using RPCVD Technique", J. Electrochem. Soc. (2011) 158(4), H457-H464, which is incorporated herein in its entirety by reference.

For chip manufacturing cost reduction, the growth of S/D regions for all P- or N-type MOS transistors should be executed simultaneously, in spite of the presence of many different types of devices in a single die. Epitaxy time is one of the most important control parameters for the S/D process: it should be chosen to avoid both under-growth and over-growth failures for all of transistors of the circuit. A main obstacle to select optimal epitaxy time is its strong dependence on growth recipe parameters, such as epitaxy temperature and precursor gases flows, as well as layout dependent parameters and transistor module target specifications (MTS). Growth time is also dependent on a chip pattern density, since during the epitaxy, a complex balance between the gas flow and reactions at the surface of exposed silicon is established.

In some existing systems, process optimization is done from scratch for every new technology and chip design. Conventionally the optimization process consists of a number of trial and error runs to determine growth time that ensures acceptable S/D shape for all transistor types. TCAD simulations can help to increase efficiency of the epitaxy process window selection, by replacement of real process runs with virtual manufacturing. Unfortunately, due to a huge difference in scale between the equipment chamber (meter scale) and transistors (tens of nm scale) it is almost impossible to treat all aspects of the CVD growth process within a single physical framework. Most epitaxy simulation models that can deal with atomic-scale effects during the epitaxy treat deposition rate as an external constant parameter. See, e.g., I. Martin-Bragado, R. Borges, J. P. Balbuena, M. Jaraiz, "Kinetic Monte Carlo simulation for semiconductor processing: A review", Progress in Materials Science (2018) 92, 1-32; and A. Dollet "Multiscale modeling of CVD film growth—a review of recent works", Surface and Coatings Technology (2004) 177-178, 245-251. Some of these models consider dependence on the gas flux, but this dependence is considered to be constant within the simulation cell. See, e.g., M. Crose, J. S. I. Kwon, M. Nayhouse, D. Ni and P. D. Christofides, "Multiscale modeling and operation of PECVD of thin film solar cells", Chemical Engineering Science (2015) 136, 50-61.

Several attempts to include local shadowing effects in the simulation were performed for atomic layer deposition (ALD) and physical vapor deposition (see, e.g., P. Wang, W. He, G. Mauer, R. Mücke, R. VaBen, "Monte Carlo simulation of column growth in plasma spray physical vapor deposition process", Surface and Coatings Technology (2018) 188-197), but the simulation is typically limited to 2D. Also, a group of authors proposed pattern-dependent simulation of effective growth rate using a continuum-based simulation tool (see, e.g., G. Wang, A. Abedin, M. Moeen, M. Kolandouz, J. Luo, Y. Guo, T. Chen, H. Yin, H. Zhu, J. Li, C. Zhao, H. H. Radamson, "Integration of highly-strained SiGe materials in 14$nm$ and beyond nodes FinFET technology", Solid-State Electronics (2015) 222-228), but their approximation is based on continuum fluid dynamics, which are not valid at typical modern logic transistor sizes. Characteristic lengths of advanced logic transistors these days are in the range of tens of nanometers, while the mean free path of the precursor molecules is above 100 nm at typical growth conditions. Thus the Knudsen number of the problem is around 10, making continuum formulation of fluid dynamics not valid. The gas flow should be treated by means of statistical mechanics e.g. similar to Direct Simulation Monte Carlo method. See Bird, G. A. (1994). Molecular Gas Dynamics and the Direct Simulation of Gas Flows. Oxford: Oxford University Press. Thus no model that is described in literature or is available in commercial TCAD software is capable to predict S/D shape of advanced 3D transistor devices at atomic level based on the input of gas fluxes at equipment level.

Even though successful attempts to connect epitaxy rate with pattern density exist, there is no attempt to analyze difference of growth rate depending on transistor type, and research is focused on the integral area of open silicon. Therefore, within existing methodologies it is not possible to predict optimal epitaxy time for circuits consisting of various types of transistors. Also, since models do not treat 3D effects of the local circuit layout and 3D structure of individual devices at the same time, it is very difficult for existing methodologies to distinguish difference of the growth rate for the devices that have the same silicon open area, but different structure parameters. For example, two structures may have the same total area of exposed silicon, but different fin pitches and fin widths.

Pattern-dependent epitaxy simulation models based on existing literature would produce the same effective growth rate for the circuits consisting of these fins, while the actual growth rate, as well as the shape of epitaxially growth S/D regions, would be quite different. Similar issues would occur if the impact of other structure parameters on the growth rate would be considered, especially for the parameters that are not directly reflected in the layout (e.g. hard mask height, etc.).

All these issues make prediction of appropriate epitaxy time very difficult for real chip layouts. For example, in spite of the existence of a general trend of optimal epitaxy time depending on a layout pattern open density, the optimal epitaxy time has a large variation depending on a distribution of transistor types in the circuit. Thus, several iterations of the process optimization are needed every time a new chip design is introduced, increasing technology development and deployment costs and time, especially for the foundry business that has to deal with various designs from customers. Therefore, there is a need for the speed-up of the optimization procedure.

The present disclosure describes simulation-based methodology to speed up this process and better control the shapes of a source and a drain in a relatively uniform manner for various types of transistors.

SUMMARY

Aspects of the present inventive concept provide a simulation method which can determine a predictable epitaxy time by accurately reflecting layout characteristics of a chip and characteristics of a source/drain formation process.

Aspects of the present inventive concept also provide a simulation system which can determine a predictable epitaxy time by accurately reflecting layout characteristics of a chip and characteristics of a source/drain formation process.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to an aspect of the present disclosure, a simulation method includes storing a plurality of structure parameters of transistors for a semiconductor chip, the structure parameters determined by using imaging equipment, generating a first local layout which includes a first structure parameter extracted from a semiconductor device included in the first local layout, the first structure parameter being an actual parameter determined using the imaging equipment, generating second to n-th local layouts by modifying the first structure parameter included in the first local layout, wherein the second to n-th local layouts respectively have second to n-th structure parameters modified from the first structure parameter, calculating first to n-th effective density factors (EDF) respectively for the first to n-th structure parameters using a predetermined simulation of the first to n-th structure parameters, determining a first effective open silicon density for a first chip using the first to n-th effective density factors and a layout of the first chip, and calculating a first epitaxy time for the first effective open silicon density, calculating second to m-th epitaxy times for second to m-th effective open silicon densities, and performing a regression analysis of effective open silicon density versus epitaxy time based on the calculation result, where n is a natural number equal to or greater than 3, and m is a natural number equal to or greater than 3.

According to another aspect of the present disclosure, a simulation system includes at least one processor and at least one storage unit which stores a simulation program executed using the processor. The simulation program is configured to generate a first local layout which comprises a semiconductor device and has a first structure parameter extracted from the semiconductor device, generate second to n-th local layouts based on modification of the first structure parameter included in the first local layout, wherein the second to n-th local layouts respectively have second to n-th structure parameters modified from the first structure parameter, calculate first to n-th effective density factors respectively for the first to n-th structure parameters using a predetermined simulation of the first to n-th structure parameters, determine a first effective open silicon density for a first chip using the first to n-th effective density factors and a layout of the first chip, and calculates a first epitaxy time for the first effective open silicon density, calculate second to m-th epitaxy times for second to m-th effective open silicon densities, and perform a regression analysis of effective open silicon density versus epitaxy time based on the calculation result, where n is a natural number equal to or greater than 3, and m is a natural number equal to or greater than 3.

According to another aspect of the present disclosure, a simulation method includes storing a plurality of structure parameters of transistors for a semiconductor chip, the structure parameters determined by using imaging equipment, generating a first local layout which includes a first structure parameter extracted from a semiconductor device included in the first local layout, the first structure parameter being an actual parameter determined using the imaging equipment, generating second to n-th local layouts by modifying the first structure parameter included in the first local layout according to process variability, wherein the second to n-th local layouts respectively have second to n-th structure parameters modified from the first structure parameter, calculating first effective source/drain growth rates for the first to n-th structure parameters using a CVD precursor impingement rate simulation of the first to n-th structure parameters, performing a regression analysis of the first to n-th structure parameters and the first effective source/drain growth rates, calculating probability distributions of the first to n-th structure parameters, calculating second effective source/drain growth rates for the first to n-th structure parameters using the regression analysis result and the calculated probability distributions, calculating first to n-th effective density factors respectively for the first to n-th structure parameters based on the second effective source/drain growth rates, determining a first effective open silicon density for a first chip using the first to n-th effective density factors and a layout of the first chip, and calculating a first epitaxy time for the first effective open silicon density, calculating second to m-th epitaxy times for second to m-th effective open silicon densities, and performing a regression analysis of effective open silicon density versus epitaxy time based on the calculation results, where n is a natural number equal to or greater than 3, and m is a natural number equal to or greater than 3.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Hereinafter, various embodiments of the present inventive concept will be described with reference to the attached drawings.

Figure 1:
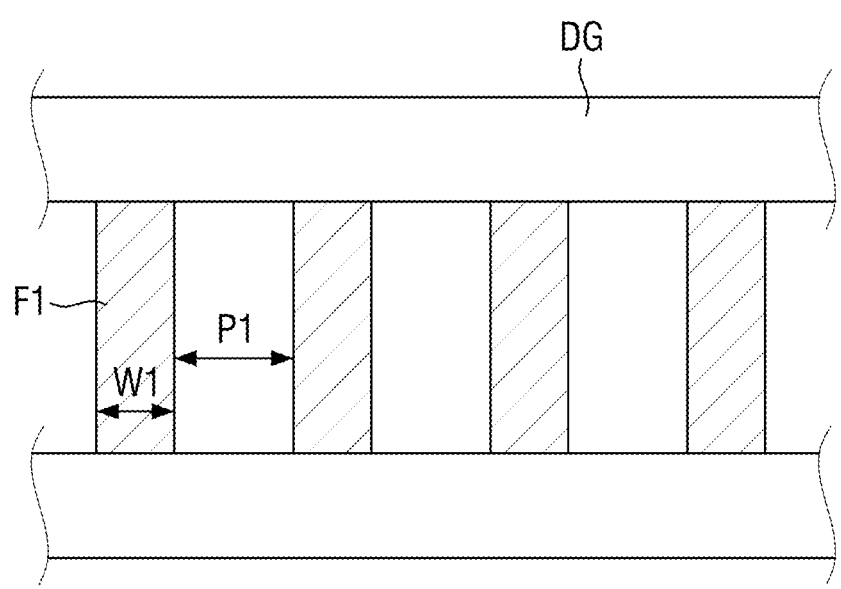
FIGS. 1 and 2 are example layouts of regions of a semiconductor device having the same open silicon area.
Figure 1:
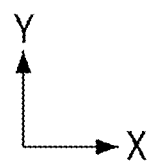
Figure 2:
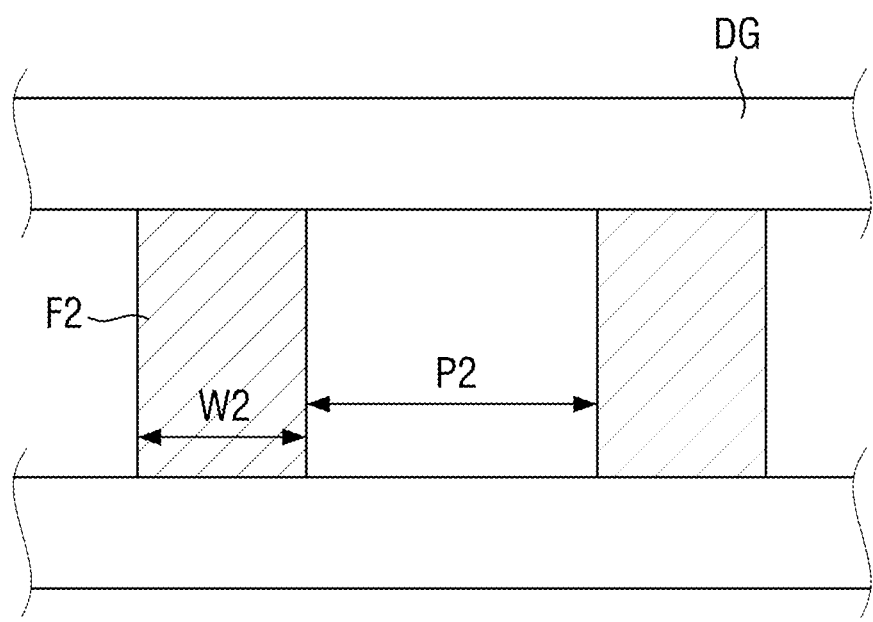

FIGS. 1 and 2 are layouts of a semiconductor device having the same open silicon area. FIG. 1 may represent a top-down view of a first semiconductor device or part of a first semiconductor device (e.g., a transistor) that has a first area from the top-down view, and FIG. 2 may represent a top-down view of a second semiconductor device or part of a second semiconductor device (e.g., transistor) that has the same first area from the top-down view.

In FIGS. 1 and 2, fins F1 and F2 having different pitches P1 and P2 are illustrated. Specifically, the fins F1 of FIG. 1 may extend in a second direction Y and may be spaced apart from each other by a first pitch P1. Dummy gates DG may extend in a first direction X intersecting the second direction Y.

The fins F2 of FIG. 2 may extend in the second direction Y like the fins F1 illustrated in FIG. 1 and may be spaced apart from each other by a second pitch P2. Dummy gates DG may also extend in the first direction X intersecting the second direction Y.

A width W2 of each of the fins F2 may be greater than a width W1 of each of the fins F1. Specifically, the width W2 of each of the fins F2 may be twice the width W1 of each of the fins F1. When the width W2 of each of the fins F2 is twice the width W1 of each of the fins F1, it can be seen that the open area of the fins 1 illustrated in FIG. 1 (e.g., area of the fins exposed with respect to an insulating layer covering portions adjacent to the fins, from a top-down view) is the same as the open area of the fins F2 illustrated in FIG. 2.

When the fins F1 illustrated in FIG. 1 and the fins F2 illustrated in FIG. 2 include silicon (Si), the layout illustrated in FIG. 1 and the layout illustrated in FIG. 2 may have the same open silicon density (e.g., same amount and/or ratio of silicon exposed with respect to an insulating layer covering portions adjacent to the fins). For example, the layout illustrated in FIG. 1 and the layout illustrated in FIG. 2 may have the same amount of open silicon area in which a source and a drain can be formed.

However, when a source and a drain are actually formed in each of the layout of FIG. 1 and the layout of FIG. 2, a different epitaxy time may be required to sufficiently form the source and the drain in each of the layout of FIG. 1 and the layout of FIG. 2. This difference may be caused by various factors, but one of the important factors may be a difference between structure parameters of the layout of FIG. 1 and the layout of FIG. 2. For example, since the width W1 of each of the fins F1 and the width W2 of each of the fins F2 are different and the pitch P1 between the fins F1 and the pitch P2 between the fins F2 are different, a different epitaxy time may be required to form a properly-working source and a drain in each of the layout of FIG. 1 and the layout of FIG. 2. This will now be described in more detail with reference to FIG. 3.

Figure 3:
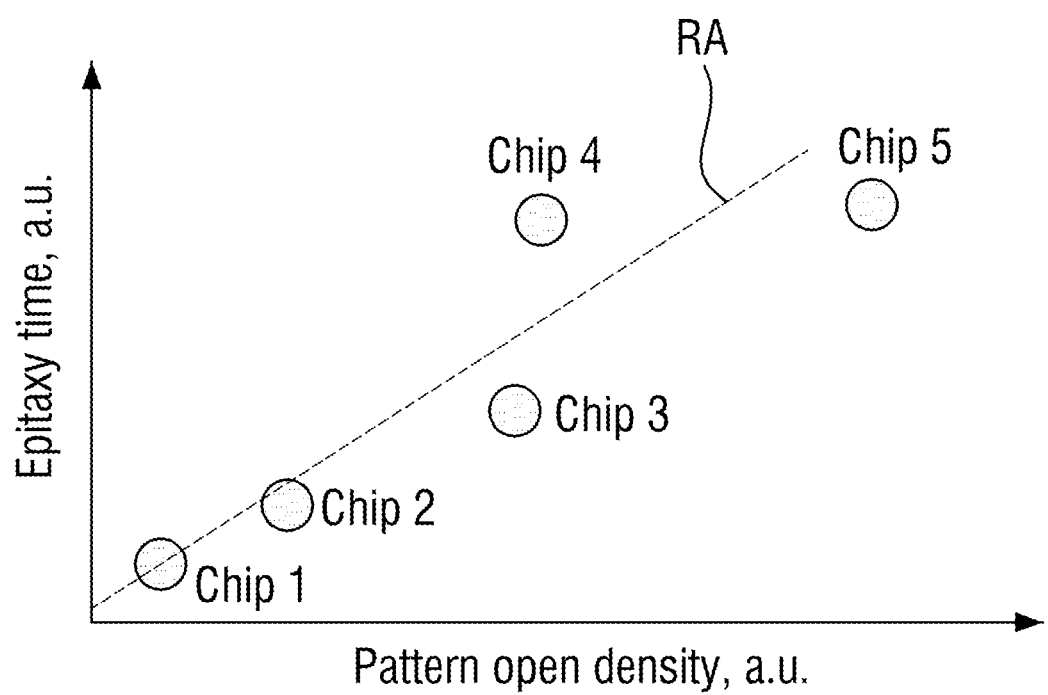
FIG. 3 is a regression analysis result of pattern open density and epitaxy time and actual epitaxy times of first to fifth chips.

FIG. 3 is a regression analysis result RA of pattern open density and epitaxy time and actual epitaxy times of first to fifth chips.

In FIG. 3, the regression analysis result RA of epitaxy time with respect to pattern open density is illustrated. Generally, as a pattern on which epitaxy should be performed has a higher open density, a longer epitaxy time is required. For example, the larger the number of open silicon areas or the larger the cross-sectional area of each open silicon area, the longer the epitaxy time. The regression analysis result RA shows this tendency well.

Referring to FIG. 3, the first chip chip 1 and the second chip chip 2 follow this tendency relatively well. However, the third chip chip 3 and the fourth chip chip 4 vary substantially from the regression analysis result RA. The fourth chip chip 4 has a slightly higher pattern open density than the third chip chip 3 but requires far more epitaxy time to actually form a source and a drain. In addition, the third chip chip 3 has a much higher pattern open density than the second chip chip 2 but requires only a slightly longer epitaxy time to form a source and a drain.

Furthermore, the fifth chip chip 5 has a considerably higher pattern open density than the fourth chip chip 4 but requires almost the same epitaxy time as the fourth chip chip 4 to form a source and a drain.

Since there is a large difference between the regression analysis result RA and the actual epitaxy time required, a process time required for actual production cannot be accurately predicted, which makes it difficult to predict a product yield. Therefore, there is a need for a model that can determine a predictable epitaxy time by accurately reflecting layout characteristics of a chip and characteristics of a source/drain formation process. Such a model improves existing technology by allowing for a faster and more automated manufacturing process, while providing a greater number of transistors to be within the proper specification in the finished product.

A simulation method that improves the predictability of epitaxy time to result in the above benefits will now be described in detail with reference to FIGS. 4 to 11.

Figure 4:
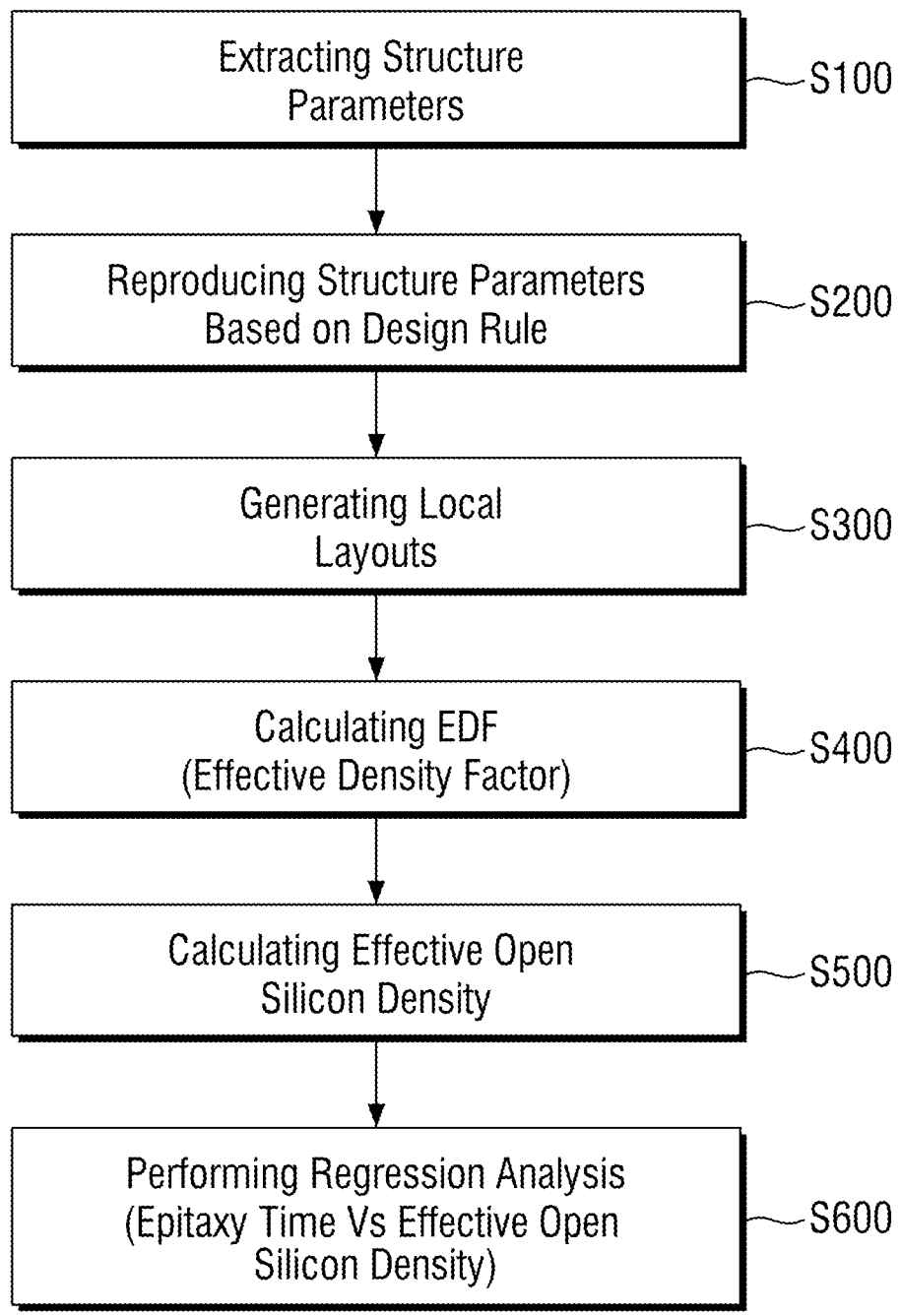
FIG. 4 is a flowchart illustrating a simulation method according to some embodiments.
Figure 5:
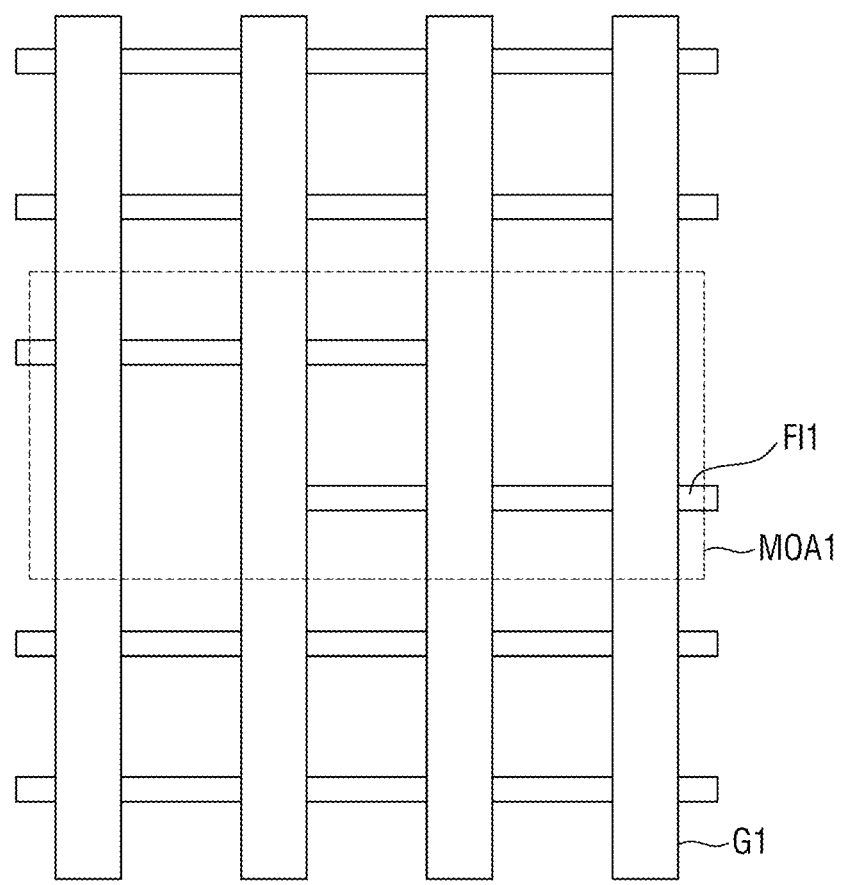
FIGS. 5 and 6 are local layouts generated by the simulation method according to some embodiments.
Figure 6:
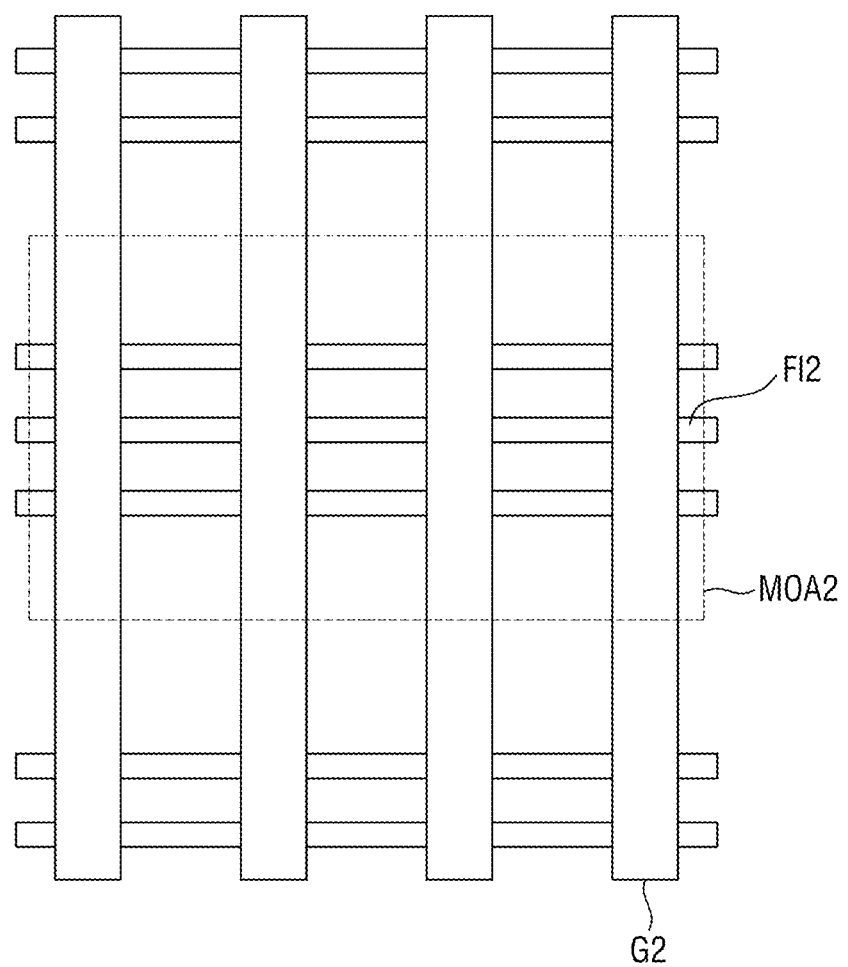
Figure 7:
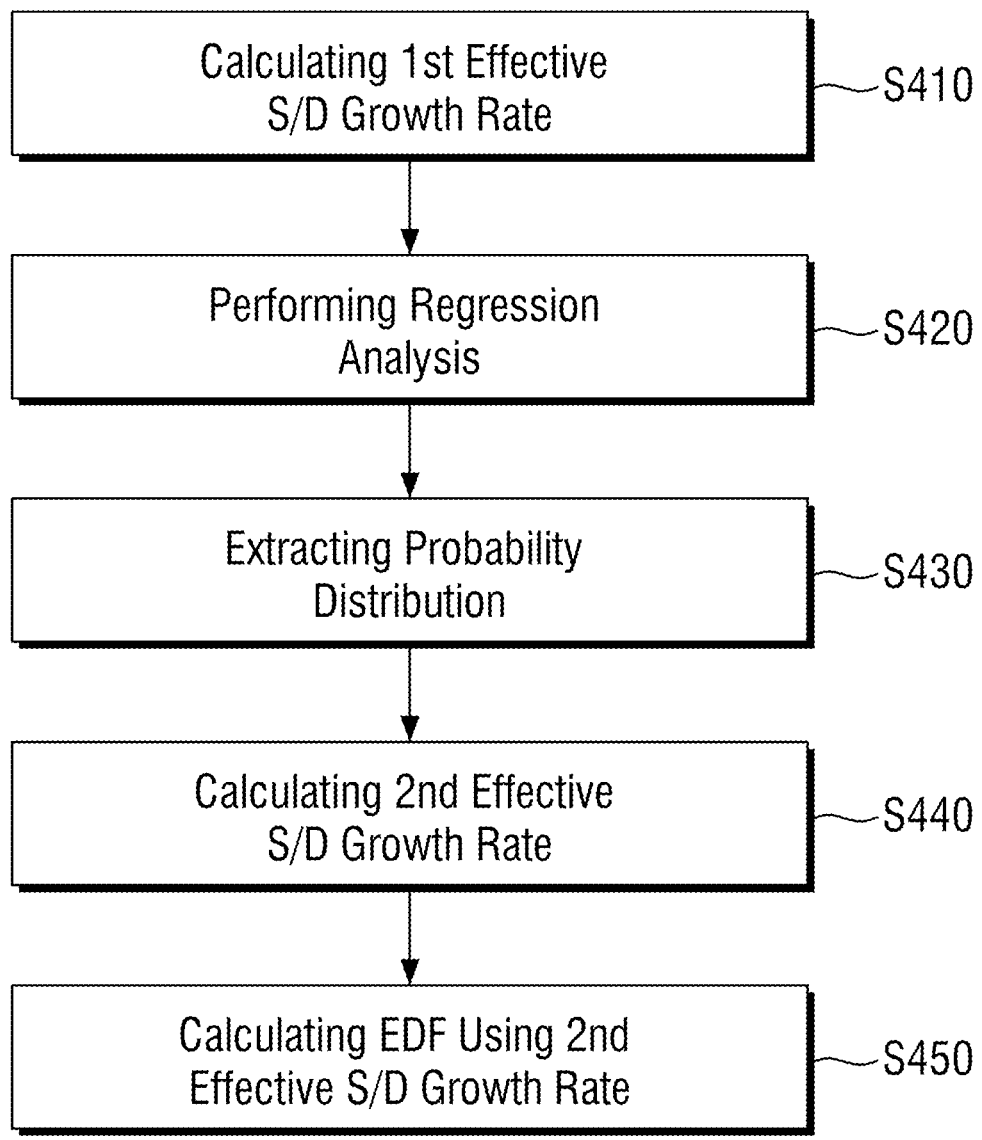
FIG. 7 is a flowchart illustrating a process of extracting an effective density factor of FIG. 4 in more detail.
Figure 8:
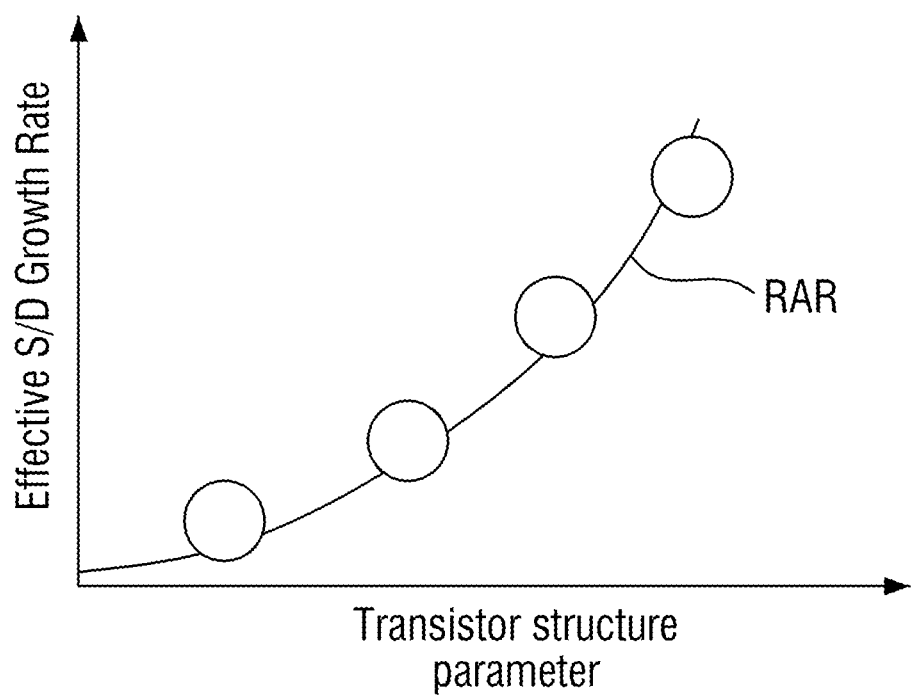
FIGS. 8 to 10 are diagrams for explaining the process of extracting an effective density factor of FIG. 4 in more detail.
Figure 9:
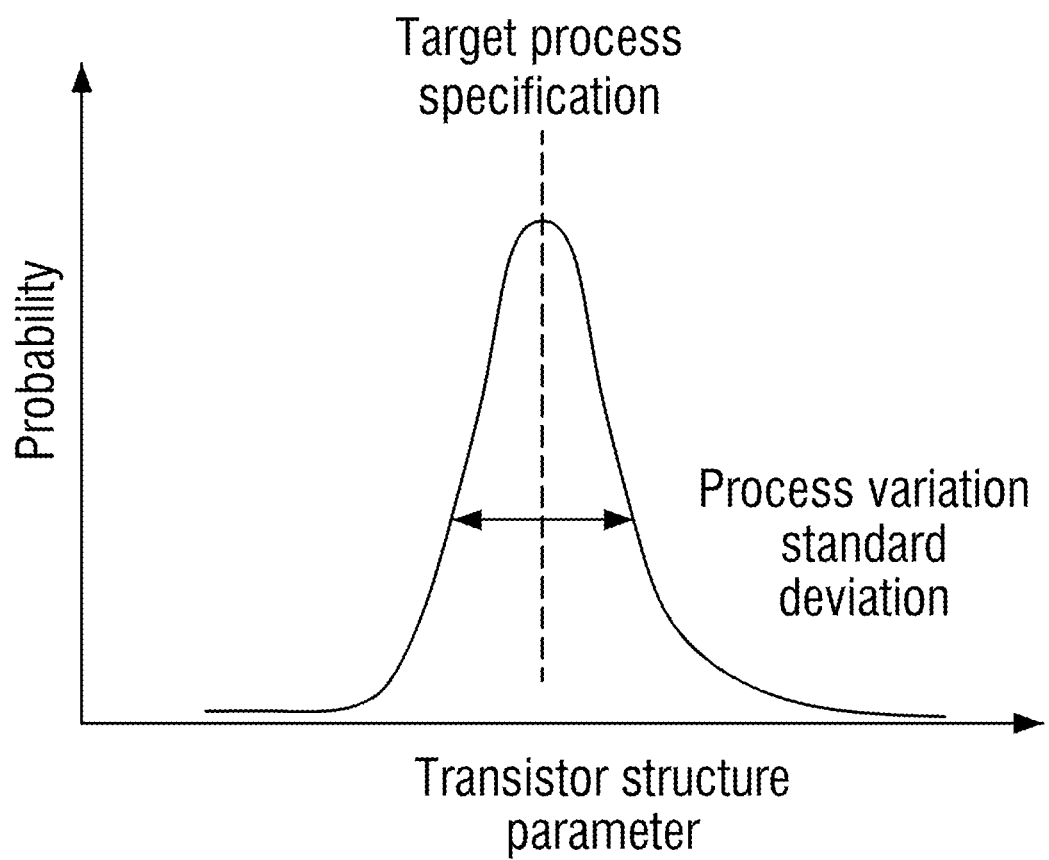
Figure 10:
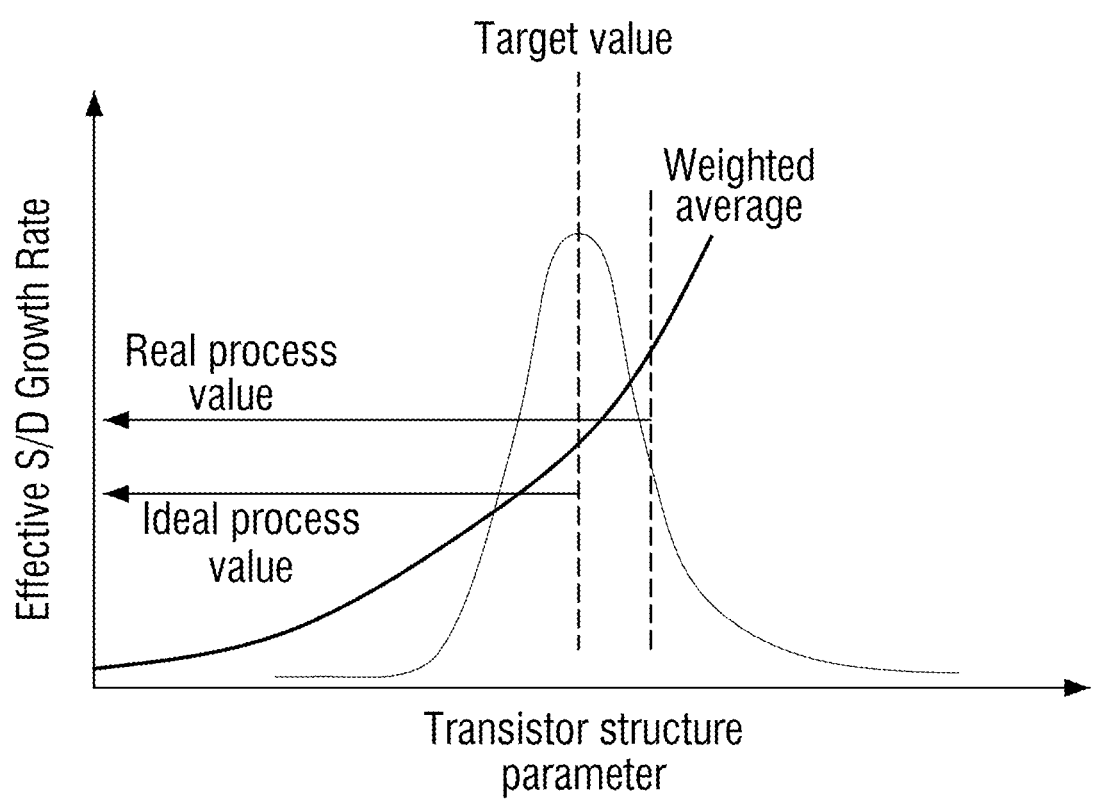
Figure 11:
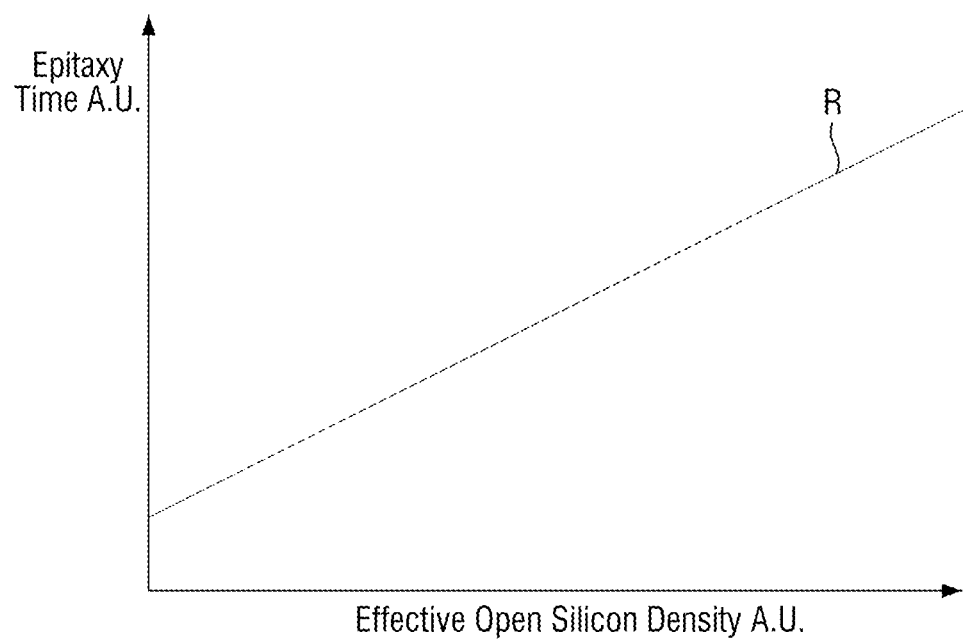
FIG. 11 is a regression analysis result generated by the simulation method according to some embodiments.

FIG. 4 is a flowchart illustrating a simulation method according to some embodiments. FIGS. 5 and 6 are local layouts generated by the simulation method according to certain embodiments. FIG. 7 is a flowchart illustrating a process of calculating an effective density factor of FIG. 4 in more detail. FIGS. 8 to 10 are diagrams for explaining the process of calculating an effective density factor of FIG. 4 in more detail. FIG. 11 is an example regression analysis result generated by the simulation method according to the above embodiments.

The analysis described herein may be carried out by one or more computers including, for example, one or more processors configured by software, such as a CPU (Central Processing Unit), GPU (graphics processor), controller, etc. The one or more computers may be general purpose computers or may be dedicated hardware or firmware (e.g., an electronic or optical circuit, such as application-specific hardware, such as, for example, a digital signal processor (DSP) or a field-programmable gate array (FPGA)). A computer may be configured from several interconnected computers. As is understood, "software" refers to prescribed rules to operate a computer, such as code or script. A storage unit, or storage device, may refer to conventional memory of a computer, such as a hard drive (which may be a solid state drive, DRAM, NAND flash memory, etc.), or to other forms of data storage. The one or more computers may include conventional computer user interfaces and include convention input devices, such as a keyboard, mouse, trackpad, touchscreen, etc. Generating layouts may be performed using the one or more computers in an automatic process, by entering user input, or by a combination of the two.

Referring to FIG. 4, in a first step, a structure parameter is extracted (operation S100).

For example, a structure parameter may be extracted from a local layout of data or an image stored in a storage unit. In some embodiments, the structure parameter may be a structure parameter of a transistor which is included in the local layout and in which a source and a drain are to be formed through epitaxial growth. However, the embodiments are not limited by these, the structure parameter may also be extracted from a semiconductor device other than the transistor.

In some embodiments, the structure parameter of the transistor may be extracted using at least one of a scanning electron microscopy image and a transmission electron microscope image. For example, a scanning electron microscope or a transmission electron microscope may be used to form an image of the transistor, and the image may be analyzed, for example, by a computer, to determine the structure parameter to be stored.

Next, the structure parameter is adjusted according to a design rule (operation S200).

The extracted structure parameter may be adjusted according to the design rule to meet actual process conditions. In this process, the extracted structure parameter may be adjusted into a form suitable for the actual process. For example, a user may manually adjust the extracted structure parameter by consulting a design rule and process condition correlation. Alternatively, a computer program may select an adjustment for the extracted structure parameter based on the design rule and process condition correlation.

Next, a local layout is formed (operation S300).

In some embodiments, a local layout may be generated by combining layout data and the structure parameter of the transistor according to layout information.

For example, referring to FIG. 5, a static random access memory (SRAM) local layout having the above adjusted structure parameter and including a transistor including fins FI1 and gates G1 may be generated. As illustrated in the drawing, this local layout may include an open area MOA1 on which source/drain epitaxial growth is to be performed.

In addition, for example, referring to FIG. 6, a logic cell local layout having the above adjusted structure parameter and including a transistor including fins FI2 and gates G2 may be generated. As illustrated in the drawing, this local layout may include an open area MOA2 on which source/drain epitaxial growth is to be performed. Each local layout may refer to a layout for an individual semiconductor device (e.g., transistor) of a semiconductor chip being designed.

Next, a plurality of local layouts are formed by modifying the structure parameter included in the local layout.

For example, a plurality of structure parameters may be generated by modifying the structure parameter of the transistor disposed in the local layout of FIG. 5 according to process variability, and a plurality of local layouts including transistors respectively having the generated structure parameters may be formed. The plurality of modified structure parameters may be generated using the structure parameter of the transistor according to, for example, data stored in the hardware of manufacturing equipment (e.g. process variability).

Specifically, when a first transistor having a first structure parameter is disposed in a first local layout, second to $n^{th}$ (where n is a natural number equal to or greater than 2) structure parameters may be generated by modifying the first structure parameter according to process variability. Then, second to $n^{th}$ transistors respectively having the second to $n^{th}$ structure parameters and second through $n^{th}$ local layouts including the second to $n^{th}$ transistors may be generated.

The local layouts thus generated respectively include transistors having different structure parameters. Therefore, an effective density factor (EDF) for an $m^{th}$ local layout (where m is a natural number satisfying $1 \leq m \leq n$) may be an effective density factor for an $m^{th}$ structure parameter. In addition, an effective source/drain growth rate for the $m^{th}$ local layout may be an effective source/drain growth rate for the $m^{th}$ structure parameter. Therefore, the effective density factor for the $m^{th}$ local layout used below may have the same meaning as the effective density factor for the $m^{th}$ structure parameter, and the effective source/drain growth rate for the $m^{th}$ local layout may also have the same meaning as the effective source/drain growth rate for the $m^{th}$ structure parameter.

Referring again to FIG. 4, an effective density factor is calculated (operation S400).

A process of calculating an effective density factor will now be described in more detail with reference to FIGS. 7 to 10.

First, referring to FIG. 7, a first effective source/drain growth rate is calculated (operation S410).

In some embodiments, a first source/drain growth rate for a set of semiconductor devices for each structure parameter (or each local layout) generated above may be calculated using a chemical vapor deposition (CVD) precursor impingement rate simulation of the structure parameters (or the local layouts).

Accordingly, not only a density factor of an open silicon pattern but also a precursor to be used in an epitaxial growth process, a growth reaction rate of the open silicon, and the like may be considered in connection with a structure parameter. Therefore, the first effective source/drain growth rate may be determined by reflecting various process factors (e.g., density factor, precursor to be used, growth reaction rate, and the structure parameter) of an actual CVD process.

Although CVD is used as an example of the epitaxial growth process in this embodiment, embodiments are not limited by this, and various plasma deposition processes, chemical deposition processes, or mechanical deposition processes can also be considered.

Next, a regression analysis is performed (operation S420).

Specifically, referring to FIG. 8, a regression analysis of each structure parameter (or each local layout) and the first effective source/drain growth rate may be performed. Accordingly, a regression analysis curve RAR for each structure parameter (or each local layout) and the first effective source/drain growth rate may be obtained. Regression analysis may be performed to determine an appropriate curve which satisfies the conditions of a transistor structure parameter and the effective S/D growth rate.

Referring again to FIG. 7, a probability distribution is calculated (operation S430).

Specifically, referring to FIG. 9, a probability distribution of each structure parameter (or each local layout) may be calculated through experimental data or theoretical assumption. The experimental data and theoretical assumption are stored in the data of hardware. Based on the assumptions on hardware data on the variation of structure parameter distribution, a probability distribution for each transistor type to have given structure dimensions is extracted.

Referring again to FIG. 7, a second effective source/drain growth rate is calculated (operation S440).

For example, a second effective source/drain growth rate for each structure parameter (or each local layout) may be calculated using the regression analysis result calculated above and the calculated probability distribution. The result depends on the assumption or data of the H/W variation. If none is available, a simple delta function with the peak at point of target structure parameter value may be used during integration. Consideration of process variation may change resulting effective growth time from the one extracted for target structure parameter specification.

Specifically, referring to FIG. 10, the second effective source/drain growth rate may be calculated by using a weighted average integration method. Assuming a Gaussian distribution of structure parameter variation and a positive derivative of a regression function, the second effective source/drain growth rate will have a larger value than a target structure parameter.

Referring again to FIG. 7, an effective density factor is extracted using the second effective source/drain growth rate (operation S450).

Specifically, an effective density factor (EDF) for each structure parameter (or each local layout) may be extracted using the second effective source/drain growth rate for each structure parameter (or each local layout).

As described above, the second effective source/drain growth is calculated in consideration of a precursor to be used in an epitaxial growth process for each structure parameter (or each local layout) and a growth reaction rate of an open silicon. Therefore, the effective density factor of each structure parameter (or each local layout) may also be determined by reflecting these process characteristics.

Next, referring to FIG. 4, an effective open silicon density is calculated (operation S500).

Specifically, an effective open silicon density for a first chip may be extracted by applying the effective density factor for each structure parameter (or each local layout) to a layout of the first chip.

In addition, an epitaxy time for the first chip (or the effective open silicon density of the first chip) is calculated. Accordingly, an epitaxy time for a specific effective open silicon density may be calculated.

Next, the effective open silicon density is calculated as described above for a plurality of chips other than the first chip, and the epitaxy time for each chip (or the effective open silicon density of each chip) is calculated. If this process is repeated, epitaxy time information for a plurality of effective open silicon densities may be obtained.

Next, a regression analysis of effective open silicon density versus epitaxy time is performed (operation S600).

If the regression analysis is performed based on the data obtained above, for example, a regression analysis result R may be obtained as illustrated in FIG. 11.

Since the regression analysis result R of FIG. 11 is generated according to the embodiment by calculating the effective open silicon density, which reflects process characteristics, for each chip and calculating the epitaxy time required for each chip based on the effective open silicon density as described above, the difference shown in FIG. 3 does not exist. Therefore, if the process conditions remain unchanged, the epitaxy time can be continuously predicted using the regression analysis result R. This can make process yield prediction easier.

Once the regression analysis result R is established, it may be used to predict an optimal epitaxy time for a new layout unless an epitaxy recipe is greatly changed.

Specifically, a physical simulation may generate a recipe database based on a limited set of experimental data, assuming that major deposition parameters (precursor gas flux, temperature, etc.) are fixed. The current embodiment requires only two different chip layouts having different open ratios and preferably different ratios between various types of transistors that can be optimized using experimental and error optimization techniques.

Once the recipe database is prepared, it may be used to select an optimal process recipe as well as determine an optimal process time for a given recipe and chip layout. For example, the recipe database may be used to determine the shortest time so as to improve production per unit time or to provide the most uniform growth rate for a transistor type and layout so as to reduce the likelihood of epitaxy growth and dump failure.

Figure 12:
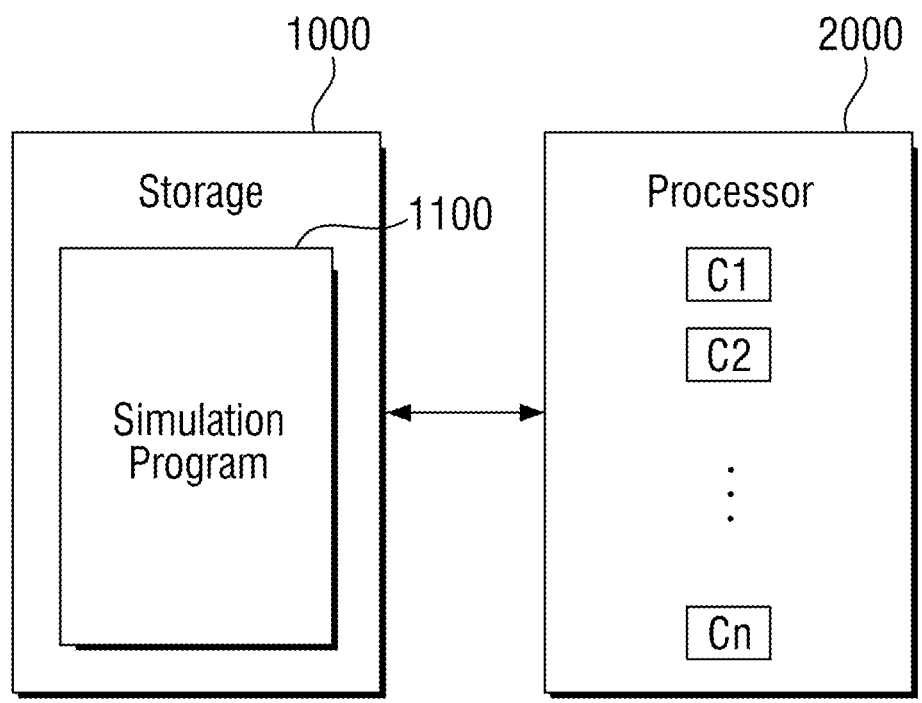
FIG. 12 is a block diagram of a simulation system according to some embodiments.

FIG. 12 is a block diagram of a simulation system according to some embodiments.

Referring to FIG. 12, the simulation method according to the embodiments described above, for example, may be employed in the simulation system implemented as software.

The simulation system may include a processor 2000 and a storage unit 1000. The simulation system may further include a main memory, a storage device (such as a solid-state drive (SSD) or a hard disk drive (HDD)) different from the storage unit 1000, a bus, and an input/output controller, but embodiments are not limited to this case. Although only some components of the simulation system are illustrated in FIG. 12, embodiments are not limited to this case. Other components can be added to the simulation system or removed from the configuration illustrated in FIG. 12.

The simulation system illustrated in FIG. 12 may be a block diagram of an office computer or a notebook computer used to simulate a semiconductor device. In addition, in some embodiments, the simulation system illustrated in FIG. 12 may be a system in a multi-processor environment driven by a plurality of cores C1 to Cn.

The processor 2000 may perform various operations needed to drive the simulation system and may execute an operating system (OS) and an application program. Although the processor 2000 is illustrated in FIG. 12 as a multi-processing system including a plurality of cores C1 to Cn, embodiments are not limited to this case.

The storage unit 1000 may be a mass data storage device for storing data and the like and may be implemented as a computer-readable recording medium such as an HDD or an SSD, but embodiments are not limited to this case. In some embodiments, the storage unit 1000 may be connected to the processor 2000 through the bus.

The storage unit 1000 may store a simulation program 1100. In some embodiments, the simulation program 1100 may be divided into a plurality of modules to perform the above-described simulation operation.

The processor 2000 may be used to execute the simulation program 1100. The processor 2000 may perform data operations and control required for the simulation program 1100.

While the present inventive concept has been particularly shown and described with reference to exemplary embodiments thereof, it will be understood by those of ordinary skill in the art that various changes in form and detail may be made therein without departing from the spirit and scope of the present inventive concept as defined by the following claims. Therefore, the exemplary embodiments described above should be considered in a descriptive sense only and not for purposes of limitation.

What is claimed is:

1. A simulation method comprising:
   storing a plurality of structure parameters of transistors for a semiconductor chip, the structure parameters determined by using imaging equipment;
   generating a first local layout which includes a first structure parameter extracted from a semiconductor device included in the first local layout, the first structure parameter being an actual parameter determined using the imaging equipment;
   generating second to n-th local layouts by modifying the first structure parameter included in the first local layout, wherein the second to n-th local layouts respectively have second to n-th structure parameters modified from the first structure parameter;
   calculating first to n-th effective density factors (EDF) respectively for the first to n-th structure parameters using a predetermined simulation of the first to n-th structure parameters, wherein the predetermined simulation is based on one or more process factors of an epitaxial growth process;
   determining a first effective open silicon density for a first chip using the first to n-th effective density factors and a layout of the first chip; and
   calculating a first epitaxy time for the first effective open silicon density, calculating second to m-th epitaxy times for second to m-th effective open silicon densities, and performing a regression analysis of effective open silicon density versus epitaxy time based on the calculation results,
   where n is a natural number equal to or greater than 3, and m is a natural number equal to or greater than 3.

2. The method of claim 1, further comprising predicting an optimal epitaxy time for a new chip layout based on the regression analysis result, wherein the predetermined simulation comprises a chemical vapor deposition (CVD) precursor impingement rate simulation.

3. The method of claim 1, wherein the generating of the first local layout comprises:
   extracting the first structure parameter from a transistor to be included in the first local layout; and
   generating the first local layout by combining layout data and the first structure parameter of the transistor according to layout information.

4. The method of claim 3, wherein the extracting the first structure parameter from the transistor comprises extracting the first structure parameter of the transistor using at least one of a scanning electron microscopy image and a transmission electron microscope image.

5. The method of claim 1, further comprising adjusting the first structure parameter according to a design rule.

6. The method of claim 1, wherein the second to n-th structure parameters are modified from the first structure parameter according to process variability.

7. The method of claim 1, further comprising calculating first effective source/drain growth rates for the first to n-th structure parameters using a CVD precursor impingement rate simulation of the first to n-th structure parameters, wherein the first to n-th effective density factors are determined based on the first effective source/drain growth rates.

8. The method of claim 7, further comprising:
   performing a regression analysis of the first to n-th structure parameters and the first effective source/drain growth rates;
   calculating probability distributions of the first to n-th structure parameters; and
   calculating second effective source/drain growth rates for the first to n-th structure parameters using the regression analysis result and the calculated probability distributions,
   wherein the first to n-th effective density factors are extracted based on the second effective source/drain growth rates.

9. The method of claim 1, wherein the calculating of the second to m-th epitaxy times for the second to m-th effective open silicon densities comprises:
   determining second to m-th effective open silicon densities for second to m-th chips using the first to n-th effective density factors and layouts of the second to m-th chips; and
   calculating second to m-th epitaxy times for the second to m-th effective open silicon densities.

10. A simulation system comprising:
    at least one processor; and
    at least one storage unit which stores a simulation program executed using the processor,
    wherein the simulation program is configured to generate a first local layout which comprises a semiconductor device and has a first structure parameter extracted from the semiconductor device; generate second to n-th local layouts based on modification of the first structure parameter included in the first local layout, wherein the second to n-th local layouts respectively have second to n-th structure parameters modified from the first structure parameter; calculate first to n-th effective density factors respectively for the first to n-th structure parameters using a predetermined simulation of the first to n-th structure parameters, wherein the predetermined simulation is based on one or more process factors of an epitaxial growth process; determine a first effective open silicon density for a first chip using the first to n-th effective density factors and a layout of the first chip; and calculate a first epitaxy time for the first effective open silicon density, calculate second to m-th epitaxy times for second to m-th effective open silicon densities, and perform a regression analysis of effective open silicon density versus epitaxy time based on the calculation results, where n is a natural number equal to or greater than 3, and m is a natural number equal to or greater than 3.

11. The system of claim 10, wherein the generating of the first local layout comprises:
    extracting the first structure parameter from a transistor; and
    generating the first local layout by combining layout data and the first structure parameter of the transistor according to layout information.

12. The system of claim 11, wherein the extracting of the first structure parameter from the transistor comprises extracting the first structure parameter of the transistor using at least one of a scanning electron microscopy image and a transmission electron microscope image.

13. The system of claim 10, wherein the simulation program is configured to additionally adjust the first structure parameter according to a design rule.

14. The system of claim 10, wherein the second to n-th structure parameters are modified from the first structure parameter and generated according to process variability.

15. The system of claim 10, wherein the simulation program calculates first effective source/drain growth rates for the first to n-th structure parameters using the CVD precursor impingement rate simulation of the first to n-th structure parameters, wherein the first to n-th effective density factors are extracted based on the first effective source/drain growth rates.

16. The system of claim 15, wherein the simulation program performs a regression analysis of the first to n-th structure parameters and the first effective source/drain growth rates; calculates probability distributions of the first to n-th structure parameters; and calculates second effective source/drain growth rates for the first to n-th structure parameters using the regression analysis result and the calculated probability distributions, wherein the first to n-th effective density factors are calculated based on the second effective source/drain growth rates.

17. The system of claim 10, wherein the calculating of the second to m-th epitaxy times for the second to m-th effective open silicon densities comprises:
extracting second to m-th effective open silicon densities for second to m-th chips using the first to n-th effective density factors and layouts of the second to m-th chips; and
calculating second to m-th epitaxy times for the second to m-th effective open silicon densities.

18. A simulation method comprising:
storing a plurality of structure parameters of transistors for a semiconductor chip, the structure parameters determined by using imaging equipment;
generating a first local layout which includes a first structure parameter extracted from a semiconductor device included in the first local layout, the first structure parameter being an actual parameter determined using the imaging equipment;
generating second to n-th local layouts by modifying the first structure parameter included in the first local layout according to process variability, wherein the second to n-th local layouts respectively have second to n-th structure parameters modified from the first structure parameter;
calculating first effective source/drain growth rates for the first to n-th structure parameters using a CVD precursor impingement rate simulation of the first to n-th structure parameters;
performing a regression analysis of the first to n-th structure parameters and the first effective source/drain growth rates;
calculating probability distributions of the first to n-th structure parameters;
calculating second effective source/drain growth rates for the first to n-th structure parameters using the regression analysis result and the calculated probability distributions;
calculating first to n-th effective density factors respectively for the first to n-th structure parameters based on the second effective source/drain growth rates;
determining a first effective open silicon density for a first chip using the first to n-th effective density factors and a layout of the first chip; and
calculating a first epitaxy time for the first effective open silicon density, calculating second to m-th epitaxy times for second to m-th effective open silicon densities, and performing a regression analysis of effective open silicon density versus epitaxy time based on the calculation results,
where n is a natural number equal to or greater than 3, and m is a natural number equal to or greater than 3.

19. The method of claim 18, wherein the generating of the first local layout comprises extracting the first structure parameter from a transistor included in the first local layout and generating the first local layout by combining layout data and the first structure parameter of the transistor according to layout information, and the calculating of the second to m-th epitaxy times for the second to m-th effective open silicon densities comprises extracting second to m-th effective open silicon densities for second to m-th chips using the first to n-th effective density factors and layouts of the second to m-th chips and calculating second to m-th epitaxy times for the second to m-th effective open silicon densities.

* * * * *